United States Patent [19]

Kanai et al.

[11] Patent Number: 5,343,197
[45] Date of Patent: Aug. 30, 1994

[54] DIGITAL-TO-ANALOG CONVERTER

[75] Inventors: Takashi Kanai, Chiba; Toshihiko Masuda, Tokyo, both of Japan

[73] Assignee: Sony Corporation, Tokyo, Japan

[21] Appl. No.: 70,618

[22] Filed: Jun. 2, 1993

[30] Foreign Application Priority Data

Jun. 12, 1992 [JP] Japan .................. 4-153672

[51] Int. Cl.[5] .......................................... H03M 1/82
[52] U.S. Cl. ...................................... 341/152; 341/136
[58] Field of Search ................ 341/136, 144, 152, 143

[56] References Cited

U.S. PATENT DOCUMENTS

| 4,408,094 | 10/1983 | Oura | 381/120 |
|---|---|---|---|
| 4,542,371 | 9/1985 | Uchikoshi | 341/152 |
| 4,929,947 | 5/1990 | Toyama | 341/146 |
| 5,021,788 | 6/1991 | Ueki et al. | 341/152 |
| 5,023,614 | 6/1991 | Fung et al. | 341/144 |
| 5,023,615 | 6/1991 | Yamada et al. | 341/152 |
| 5,148,168 | 9/1992 | Masuda et al. | 341/152 |
| 5,164,725 | 11/1992 | Long | 341/118 |

*Primary Examiner*—Marc S. Hoff
*Attorney, Agent, or Firm*—Lewis H. Eslinger; Jay H. Maioli

[57] ABSTRACT

A pair of equilibrium output signals P(+) and P(−) from a 1-bit D/A converter IC, which is made up of an oversampling filter, noise shaper and a pulse converter, are supplied to a pair of field effect transistors connected in a common drain configuration. A constant current $I_0$ is supplied to the common drain from a constant current source and at least one of the source output currents is converted by an output circuit into a voltage. In this manner, a 1-bit D/A converted output signal freed of fluctuations of the power source is provided at an output terminal.

5 Claims, 5 Drawing Sheets

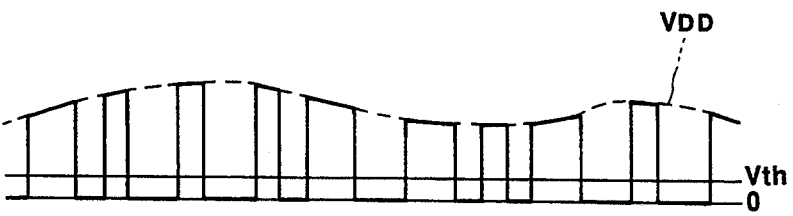
FIG.3 A P(+)
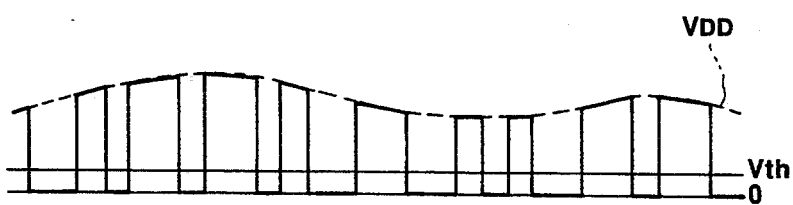
FIG.3 B P(−)
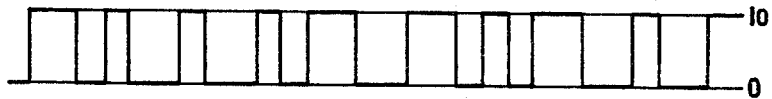
FIG.3 C IP+
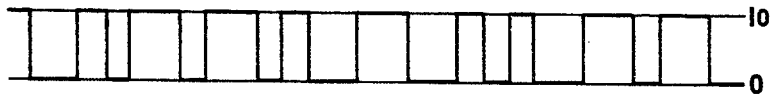
FIG.3 D IP−

DIGITAL-TO-ANALOG CONVERTER

BACKGROUND OF THE INVENTION

1. Field of the Invention

This invention relates to a digital-to-analog (D/A) converter for converting digital signals, such as audio or video digital signals, into analog signals.

2. Description of the Related Art

There has recently been known a 1-bit D/A converter for translating digital audio or video signals into original analog signals, such as 1-bit D/A converter, as disclosed in e.g. US Pat. Nos. 5,021,788 with 5,148,168. The 1-bit D/A converter has many advantages not achieved with a multi-bit type converter particularly with respect to linearity, such as freedom from zero-crossing distortion.

An output of the 1-bit D/A converter is a pulse train taking on two voltage values of 0 V and a source voltage, usually on the order of 5 V. The output level is determined by the product of the pulse density and the source voltage. Specifically, an analog output waveform is obtained by passing an output of the D/A converter through a low-pass filter (LPF).

Meanwhile, the power source voltage, which is the wave crest value of an output pulse of the 1-bit D/A converter, is the external power source itself and is subject to disturbances. If the power source voltage fluctuates or the noise is superimposed thereon, the disturbed voltage is directly presented via LPF in the ultimate analog output.

Besides, if the 1-bit D/A converter is arranged as an integrated circuit, the power source voltage is that of the integrated circuit (IC), which cannot be raised to a value higher than the standard value of 5 V if a satisfactory IC operation is to be maintained. The result is that a limitation is necessarily placed on the output signal level which is usually set to the level on the order of 1 V or less on an average. This lower voltage is amplified by providing a gain in an analog LPF unit downstream of the D/A converter for increasing the signal level. However, this leads to amplification of the noise as well.

OBJECT AND SUMMARY OF THE INVENTION

In view of the above-depicted status of the art, it is an object of the present invention to provide a digital-to-analog converter which is not affected by power source fluctuations or noise superposition and which is able to prevent the noise from being amplified as a result of increasing the gain of the downstream side analog filter.

According to the present invention, there is provided a digital-to-analog converter comprising 1-bit digital-to-analog converting means for converting input digital data into a corresponding pulse waveform, a pair of field effect transistors in a drain common configuration, each having its gate supplied with one of a pair of output signals of the 1-bit digital-to-analog converting means which are inverted signals relative to each other, a constant current source for supplying a constant current to the common drain of the field effect transistors, and an output circuit for outputting signals from at least one of the field effect transistors.

The output circuit preferably has current-voltage converting means for converting a source output current of one of the field effect transistors into a corresponding voltage and outputting the resultant voltage. The current value of the constant current source is preferably variably controlled to assure a variable output signal level.

Since the output signals of the 1-bit digital-to-analog converting means are inverted signals with respect to each other, one of the field effect transistors is necessarily in the turned-on state to cause the constant current to flow from the constant current source, so that the current output is exempt from fluctuations proper to the power source. By taking out the current output via an output circuit, a satisfactory digital-to-analog conversion output may be produced which is exempt from the fluctuations proper to the power source.

With the digital-to-analog converter according to the present invention, the equilibrium output signal pair from the 1-bit digital-to-analog converting means outputting a pulse waveform corresponding to the inputs digital data are supplied to the gates of the FET pair connected in a drain common configuration. The current from the constant current source is supplied to the common drain of the FET pair and output signals of the sources of the FET pair are taken out via an output circuit Consequently, one of the paired FETs is necessarily turned on to cause the constant current freed of power source fluctuations to flow from the constant current source. By taking out the current output via the output circuit, a satisfactory and highly accurate digital-to-analog conversion output may be produced which is exempt from power source fluctuations.

Besides, the current value of the constant current source may be variably controlled for rendering the output signal level variable to produce an output having an amplitude level not lower than the output of the 1-bit digital-to-analog converting means to assure a broader dynamic range. In addition, it is also possible to prevent the noise from being amplified because there is no necessity of raising the gain at the downstream side analog low-pass filter (LPF).

Other objects and advantages of the present invention will become more apparent from the following description of preferred embodiments and the appended claims

BRIEF DESCRIPTION OF THE DRAWINGS

FIGS 3A to 3D are waveform diagrams showing signal waveforms for illustrating the operation of the embodiment shown in FIG. 2.

DETAILED DESCRIPTION OF THE PREFERRED EMBODIMENTS

Figure 1:
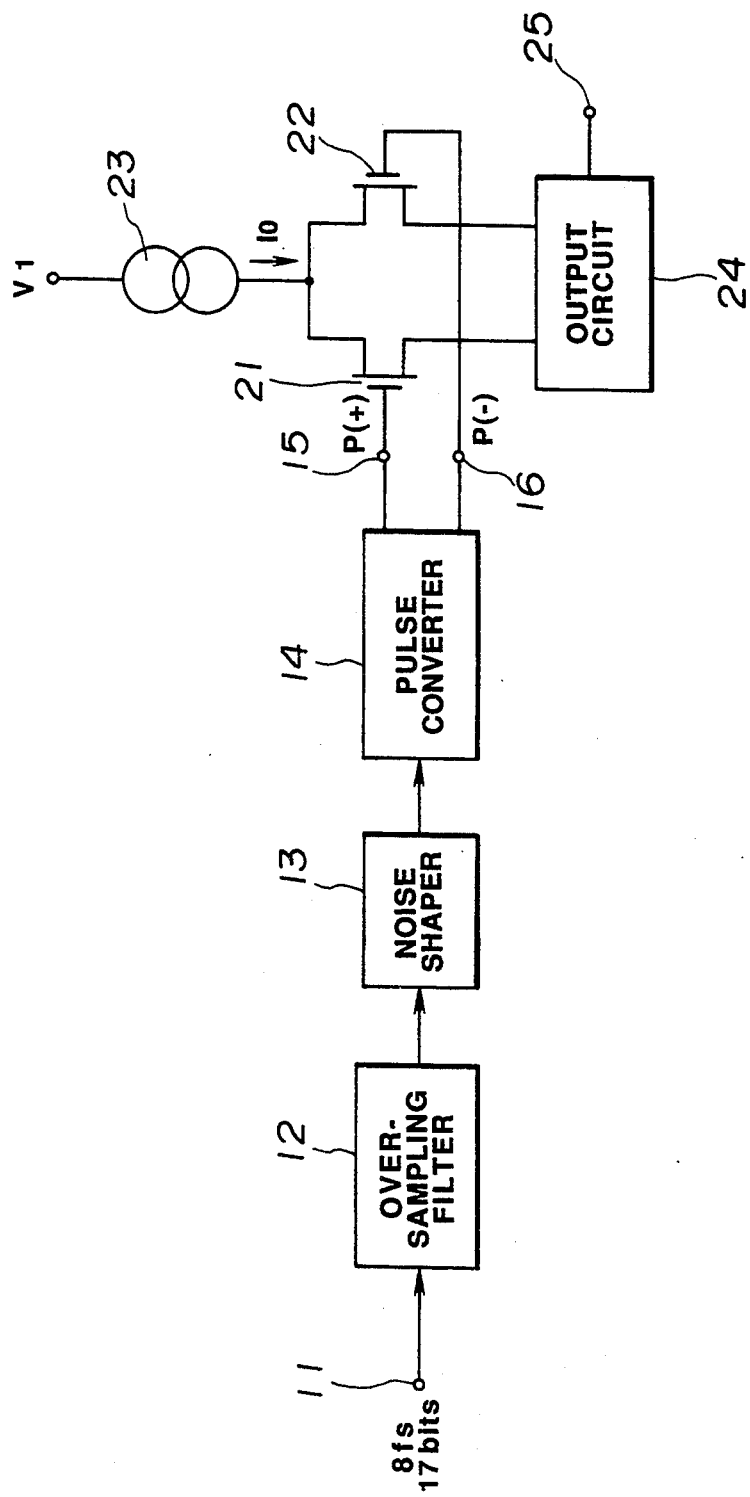
FIG. 1 is a block diagram showing a fundamental constitution of the D/A converter according to the present invention

FIG. 1 is a schematic block circuit diagram showing an example of a fundamental constitution of the D/A converter according to the present invention. In this figure, digital signals, such as digital audio signals, are supplied to an input terminal 11. The data rate and the word length of these digital input signals are 8 fs and 17 bits, as an example, where fs means a sampling frequency. The 8-fs 17-bit digital signals are over-sampled by e.g. a factor of 8 by an oversampling filter 12 to 64 fs data rate signals which are transmitted to a noise shaper 13. The noise shaper 13 effects a noise shaping operation of localizing the noise spectrum exclusively in a higher frequency region. An output of the noise shaper 13 is transmitted to a pulse converter 14 where it is translated into 1-bit digital signals or pulse signals so that a pair of equilibrium pulse signals P(+) and P(−), which are inverted with respect to each other, are outputted at terminals 15 and 16, respectively.

The circuitry from the eight-fold oversampling filter 12 up to the pulse converter 14 is usually supplied as a so-called 1-bit D/A converter integrated circuit (IC). The pulse signals P(+) and P(−) are substantially at a ground potential (GND) and at a source voltage $V_{DD}$ of the integrated circuit, usually on the order of 5 V, when the pulse signals are at the "0" or "low" level or at the "1" or "high" level, respectively. The source voltage $V_{DD}$ or the ground voltage GND tends to be subjected to voltage fluctuations or superimposed with noises, as described previously.

The pulse signals P(+) and P(−) from terminals 15 and 16, which are inverted with respect to each other, are supplied to gates of a pair of field effect transistors (FETs) 21 and 22 connected in the common drain configuration. A constant current $I_0$ is supplied to the drains of these FETs 21, 22, connected in common, from a constant current source 23, which is supplied with a constant voltage $V_1$. Output signals from the sources of the FETs 21, 22 are transmitted to an output circuit 24 so as to be taken out at output terminal 25. As the output circuit 24, a circuit may be employed in which at least one of output currents from the sources of the FETs 21, 22 is converted into a voltage which is outputted at output terminal 25. Alternatively, a pair of equilibrium output voltages, which are inverse signals with respect to each other, may be taken out at a pair of output terminals, as outputs of the output circuit 24.

By the above-described arrangement, voltage fluctuations or noises, which have affected the pulse signals P(+) or P(−), are removed via output terminal 24, so that a satisfactory D/A conversion output, not affected by the voltage fluctuations or noises, may be taken out at output terminal 25. The FETs 21, 22 are used herein in consideration that, if ordinary bipolar transistors are used, a base-to-emitter current flows by overswing during the switching operation of the transistors by the pulse signal P(+) or P(−) so as to be superposed on the output current to cause output fluctuations, Since the FET has a high gate input impedance, there is no risk of the gate current flowing at the output on the occasion of the overswing of the pulse signal P(+) or P(−).

Figure 2:
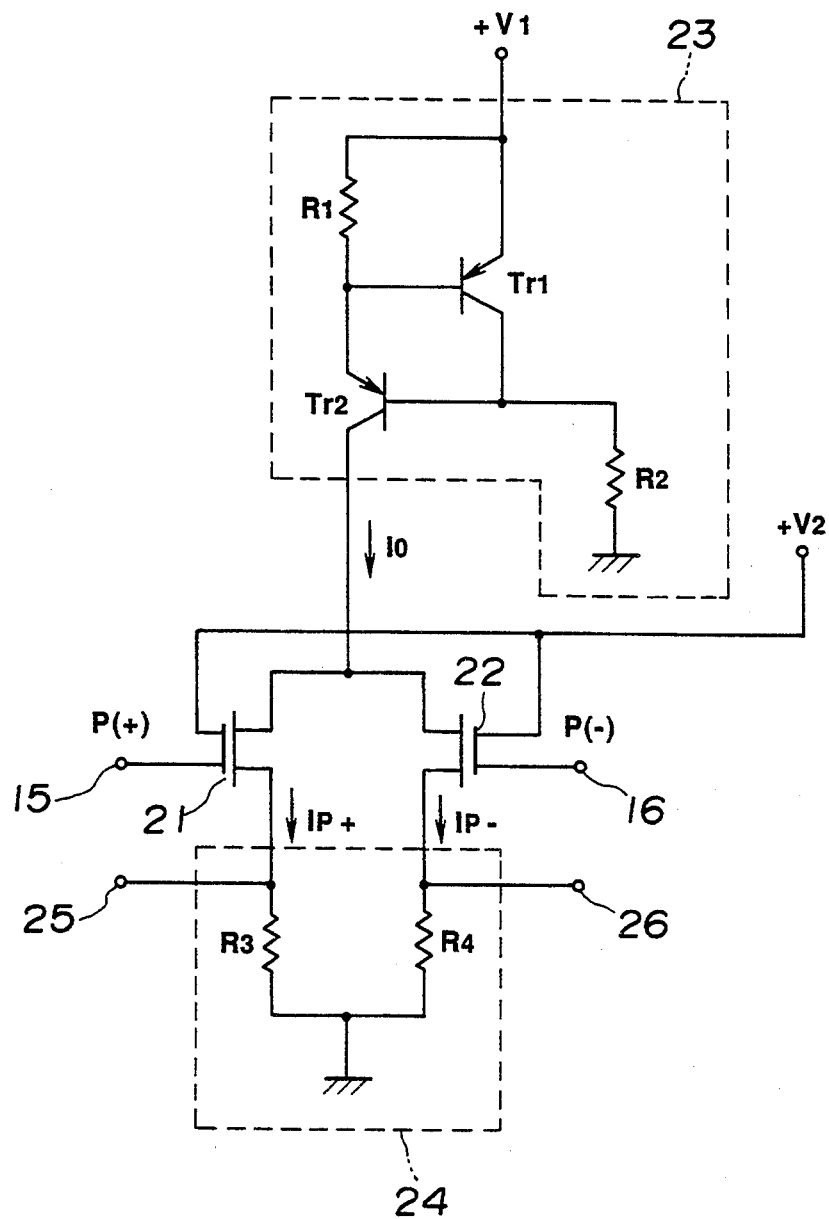
FIG. 2 is a circuit diagram showing essential portions of a first embodiment of the D/A converter according to the present invention.

The circuit diagram of FIG. 2 shows, in a circuit diagram, a concrete constitution of the output side circuitry downstream of the terminals 15 and 16 as a first embodiment of the present invention.

In FIG. 2, the above-mentioned pulse signals P(+) and P(−), which are inverted with respect to each other, are supplied to the terminals 15 and 16, respectively. As the FETs 21, 22, connected in the drain common configuration, so-called dual-gate FETs are employed, and a constant voltage $V_2$ is applied to so-called screening gates of the FETs 21, 22. The aforementioned pulse signals P(+), P(−) from terminals 15, 16 are supplied to the other gates of the FETs 21, 22, The constant current source 23 for supplying the constant current $I_0$ to the common drains of the dual-gate FETs 21, 22 comprises a PNP transistor $T_{r1}$, to an emitter of which the constant voltage $V_1$ is supplied, a resistor $R_1$, connected across the emitter and the base of the transistor $T_{r1}$, another PNP transistor $T_{r2}$, to a base and an emitter of which the collector and the base of the transistor $T_{r1}$ are connected, and a resistor $R_2$ connected across the base of transistor $T_{r2}$ (or the collector of the transistor $T_{r1}$) and the ground. The constant current $I_0$ is supplied from the collector of transistor $T_{r2}$.

The output circuit 24 for outputting a voltage converted from output currents $T_{p+}$, $I_{p-}$ from the sources of the FETs 21, 22, is made up of a load resistor $R_3$, as current-voltage converting means, connected across the source of the FET 21 and the ground, and another load resistor $R_4$, as current-voltage converting means, connected across the source of the FET 22 and the ground. A voltage output from a junction between the load resistor $R_3$ and the source of FET 21 of output circuit 24 is taken out at output terminal 25, and a voltage output from a junction between the load resistor $R_4$ and the source of FET 22 is taken out at output terminal 26.

The switching operation of the FETs 21, 22 is incurred by the pulse signals P(+) and P(−) supplied to the gates of the FETs. Since the pulse signals P(+) and P(−) are inverted signals with respect to each other, one of the FETs 21, 22 is turned on when the other of the FETs is turned off. Since the threshold voltage $V_{th}$ of each of the FETs 21, 22 is set to a value sufficiently lower than the voltage of the IC voltage source $V_{DD}$, usually on the order of 5 V, as the "high" level of the pulse signal P(+) or P(−), so that, even if the waveform of the pulse signal P(+) or P(−) is fluctuates as indicated at A and B in FIG. 3 due to fluctuations in the IC source voltage $V_{DD}$, the "high" value of the pulse signal positively exceeds the threshold voltage $V_{th}$ to assure a reliable turn-on operation. The constant current $T_0$ flows through one of the FETs 21 and 22 which is turned on, while no current flows through the other FET which is turned off. Thus the output source currents $I_{p+}$ and $I_{p-}$ of the FETs 21 and 22 are set to 0 and the above-mentioned constant current $I_0$, respectively, so that the fluctuations of the source voltage are removed The output currents $I_{p+}$ and $I_{p-}$ of the FETs 21 and 22, thus freed of the fluctuations, are converted by the load resistors $R_3$, $R_4$ into voltages which are taken out at output terminals 25, 26 in the form Of 1-bit D/A converted output voltage signals. In this manner, the D/A conversion may be improved in accuracy because these output voltage signals are exempt from the effects of the source voltage $V_{DD}$. The effects of fluctuations in the ground voltage GND caused by switching of the FETs 21, 22 may be eliminated, as a principle, because one of the FETs 21 and 22 is necessarily in the turned-on state at all time FIG. 4 shows, in a circuit diagram, the constitution of essential portions of the second embodiment of the present invention.

In this figure, the constitution of the dual-gate FETs 21, 22 and the constant current source is similar to that of the first embodiment shown in FIG. 2, so that the corresponding parts are indicated by the same numerals and the corresponding description is omitted. The output circuit 24 of the second embodiment shown in FIG. 4 represents a concrete example in which the source output current $I_{p+}$ of FET 21 is transmitted via resistor $R_3$ to an operational amplifier 27 for translating the current into a corresponding voltage which is outputted at output terminal 25.

Figure 4:
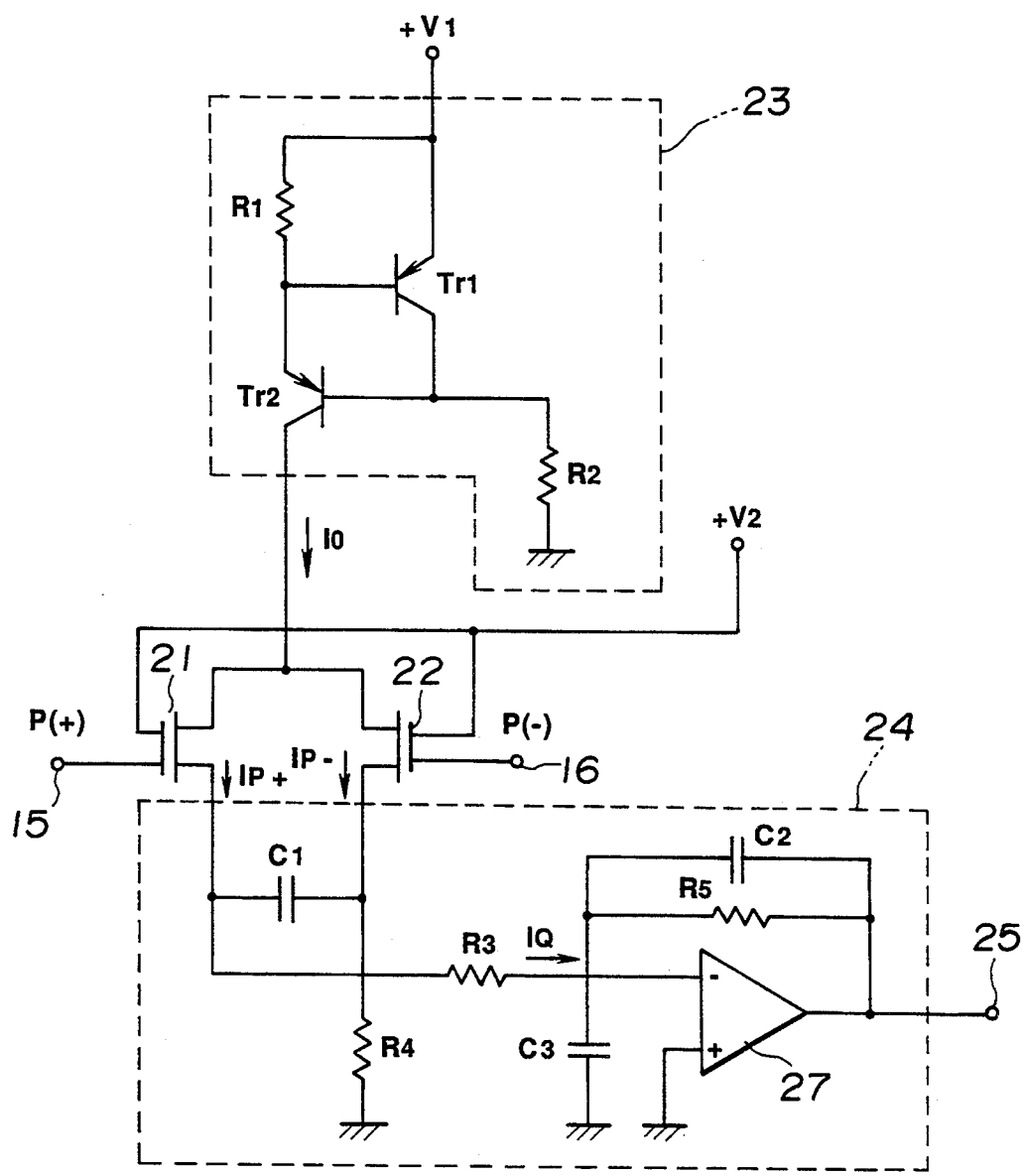
FIG. 4 is a circuit diagram showing essential portions of a second embodiment according to the present invention.

In the output circuit 24, shown in FIG. 4, a capacitor $C_1$ for removing the high-frequency noise is connected across the sources of the dual-gate FETs 21, 22. The capacitor $C_1$ plays the role of relieving the operating load of the operational amplifier 27 and as a first stage of an analog low-pass filter (LPF) for translating the D/A translation output into an analog output. The FET 22 has its source grounded via resistor $R_4$. The FET 21 has its source connected via resistor $R_3$ to an inverting input terminal of the operational amplifier 27, which inverting output terminal is grounded via capacitor $C_3$. The non-inverting input terminal of the operational amplifier 27 is grounded. A parallel circuit of a resistor $R_3$ and a capacitor $C_2$ is connected across an output terminal 25 and the inverting input terminal of the operational amplifier 27.

With the above-described arrangement, the inverting input terminal of the operational amplifier 27, which has the non-inverting terminal grounded, is maintained at a potential substantially equal to zero by so-called imaginary shorting, so that the current $I_Q$ flowing via resistor $R_5$ towards the inverting terminal is caused to flow through resistor $R_5$ and hence an output voltage equal to a voltage of $R_5 I_Q$ is produced at output terminal 25. The capacitors $C_2$ and $C_3$ play the role of eliminating high-frequency components. An output voltage corresponding to the pulse signal P(+) freed of source voltage fluctuations is produced at the output terminal 25 of the operational amplifier 27. Since one of the FETs 21, 22 is in the turned-on state at all times, that is, the constant current $I_0$ necessarily flows through one of the FETs 21 and 22 that is turned on, the output voltage is exempt from fluctuations otherwise caused by switching.

Figure 5:
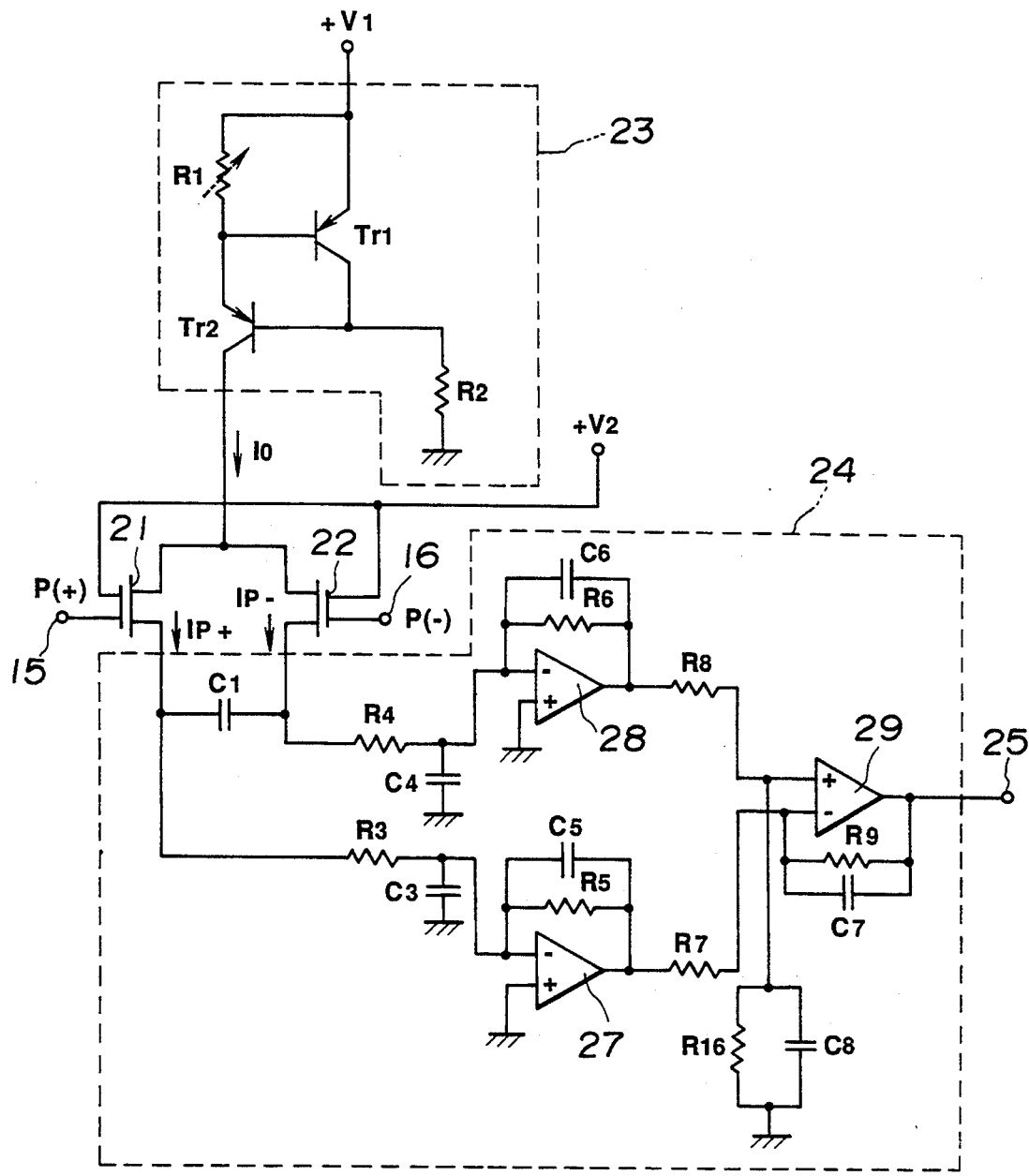
FIG. 5 is a circuit diagram showing essential portion of a third embodiment according to the present invention.

FIG. 5 shows, in a circuit diagram, the constitution of essential portions of a third embodiment of the present invention.

In this figure, the parts or components similar to those of the second embodiment shown in FIG. 3 are denoted by the same reference numerals and corresponding description is omitted for clarity. The output circuit 24, employed in the present third embodiment, shown in FIG. 5, is arranged so that the source output voltages $I_{p+}$ and $I_{p-}$ of the FETs 21, 22 are supplied via resistors $R_3$, $R_4$ to operational amplifiers 27, 28, respectively, for translating the electrical current into corresponding electrical voltage, and the outputs of these operational amplifiers 27, 28 are synthesized by an operational amplifier 29 so as to be outputted at output terminal 25.

With the output circuit 24, shown in FIG. 5, a parallel connection of a resistor $R_5$ and a capacitor $C_5$ is connected across the output terminal and the inverting input terminal of the operational amplifier 27, with the output terminal of the operational amplifier 27 being connected via resistor $R_7$ to the inverting input terminal of the operational amplifier 29. A parallel connection of a resistor $R_9$ and a capacitor $C_7$ is connected across the output terminal and the inverting input terminal of the operational amplifier 29. The FET 22 has its source connected via resistor $R_4$ to the inverting input terminal of the operational amplifier 28, which inverting input terminal is grounded via a capacitor $C_4$. The operational amplifier 28 has its non-inverting input terminal grounded. A parallel connection of a resistor $R_6$ and a capacitor $C_6$ is connected across the output terminal and the inverting input terminal of the operational amplifier 28. An output terminal of the operational amplifier 28 is connected via resistor $R_8$ to the non-inverting input terminal of the operational amplifier 29. The operational amplifier 29 has its non-inverting input terminal grounded via a parallel connection of a resistor $R_{10}$ and capacitor $R_8$. An output terminal of the operational amplifier 29 becomes the output terminal 25 of the output circuit 24. Meanwhile, the resistors $R_3$, $R_4$ or the capacitors $C_1$, $C_5$ of $C_6$ etc. may also be eliminated, if so desired.

The third embodiment, shown in FIG. 5 is arranged so that, in addition to the constitution of the second embodiment shown in FIG. 4, the output current $I_{p-}$ of FET 22, which is switched by the voltage of the pulse signal P(−), is translated by the operational amplifier 28 into a corresponding output voltage which is differentially amplified with the output voltage of the operational amplifier 27 by the operational amplifier 29 to produce a differential output voltage at the output terminal 25. The capacitor $C_7$ and the resistor $R_9$ as well as the capacitor $C_8$ and the resistor $R_{10}$ are employed for eliminating high-frequency components. It is possible with the above-described differential arrangement to remove the in-phase noise, such as grounding noise.

With $V_1 = 10$ V, $V_2 = 5$ V, $R_1 = 330$ Ω, $C_1 = 2200$ pF, $R_3 = R_4 = 470$ Ω, $C_3 = C_4 = 330$ pF, $R_5 = R_6 = 2$ kΩ, $C_5 = C_6 = 1500$ pF, $R_7 = R_8 = R_9 = R_{10} = 5.6$ kΩ and $C_7 = C_8 = 100$ pF, as concrete numerical values for the circuit of FIG. 5, with the pulse signals P(+) and P(−) being a pal r of equivalent outputs of the 1-bit D/A converter IC, and with the input signal to the 1-bit D/A converter IC being a 17-bit equivalent sinusoidal wave, the values of the distortion rate (THD+N) of 0.0021% (−93.5 dB) and the S/N ratio of 106 dB could be obtained, which represent practically satisfactory values.

By way of a fifth embodiment of the present invention, an output voltage level of the output circuit 24 may be variably control led by changing the current value $I_0$ of the constant current source 23 which is rendered variable. With the constant current source 23, arranged as shown in FIG. 5, the current value $I_0$ may be rendered variable by designing the resistor $R_1$ as a variable resistor, such that the relationship of $I_0 = 0.6 R_1$ may hold.

By rendering the current value $I_0$ of the current source variable, the output signal level may be rendered variable, and an output of an amplitude level exceeding the output level of the 1-bit D/A converter IC may be obtained, resulting in a broader dynamic range. Besides, since there is no necessity of increasing the gain at a downstream side analog LPF, it becomes possible to prevent the noise from being amplified.

It is to be noted that the present invention is not limited to the above-described embodiments. For example, the arrangement of the 1-bit D/A converter IC is not limited to the embodiment shown in FIG. 1, while the voltage values of the various components are not limited to the concrete values of the above-described embodiments. Besides, the arrangements of the constant current source 23 and the output circuit 24 shown in FIGS. 2, 4 and 5 are is not limited to the arrangement shown and the capacitors $C_1$ and $C_2$, for example, may be omitted, if so desired.

What is claimed is:

1. A digital-to-analog converter comprising:
   converting means for converting input digital data into a corresponding pulse waveform including a pair of output signals which are inverted relative to each other, a pair of field effect transistors in a common drain configuration, each having a gate supplied with one of said pair of output signals of said converting means, a constant current source for supplying a constant current to the common drain of said field effect transistors, and an output circuit for supplying output signals from at least one of said field effect transistors.

2. The digital-to-analog converter as claimed in claim 1 wherein said output circuit has current-voltage converting means for converting a source output current of one of the field effect transistors into an output voltage.

3. A digital-to-analog converter as claimed in claim 1 wherein said output circuit has a pair of current-voltage converting means for converting a source output current of each of the field effect transistors into an output voltage and differential amplifying means supplied with said output voltage.

4. The digital-to-analog converter as claimed in claim 1 further comprising means for variably controlling the current values of said constant current source for changing the level of said output signals.

5. The digital-to-analog converter as claimed in claim 1 wherein said field effect transistor is of dual-gate construction.

* * * * *